United States Patent [19]

Sakurai

[11] Patent Number: 5,700,348
[45] Date of Patent: Dec. 23, 1997

[54] METHOD OF POLISHING SEMICONDUCTOR SUBSTRATE

[75] Inventor: Michio Sakurai, Tokyo, Japan

[73] Assignee: NEC Corporation, Japan

[21] Appl. No.: 758,761

[22] Filed: Dec. 3, 1996

Related U.S. Application Data

[63] Continuation of Ser. No. 354,284, Dec. 12, 1994, abandoned.

[30] Foreign Application Priority Data

Dec. 15, 1993 [JP] Japan .................. 5-342852

[51] Int. Cl.$^6$ .................. H01L 21/00; B24B 1/00
[52] U.S. Cl. .................. 156/636.1
[58] Field of Search .................. 156/636.1, 645.1; 134/2

[56] References Cited

U.S. PATENT DOCUMENTS

| | | | |
|---|---|---|---|
| 4,050,954 | 9/1977 | Basi | 134/2 |
| 5,261,966 | 11/1993 | Mashimo et al. | 134/2 |
| 5,320,706 | 6/1994 | Blackwell | 134/33 X |
| 5,409,770 | 4/1995 | Netsu et al. | 428/310.5 |

FOREIGN PATENT DOCUMENTS

| | | | |
|---|---|---|---|
| 62-198127 | 9/1987 | Japan | H01L 21/304 |
| 63-19825 | 1/1988 | Japan | H01L 21/306 |
| 2116130 | 4/1990 | Japan | H01L 21/304 |
| 94435 | 4/1990 | Japan | |

*Primary Examiner*—Thi Dang
*Attorney, Agent, or Firm*—Hayes, Soloway, Hennessey, Grossman & Hage, P.C.

[57] ABSTRACT

In a CMP (chemical and mechanical polishing) method in which an insulating film is formed on one surface (back surface) of a semiconductor substrate and then the insulating film is chemically and mechanically polished with abrasive, an insulating thin film is formed on the surface of the semiconductor substrate on which no insulating film is provided and silicon is exposed to the outside, and a hydrophilic film is formed on the surface of the insulating thin film. Thereafter, the CMP is conducted to polish the insulating film on the back surface, and then the abrasive is chemically and physically removed. Accordingly, by providing the hydrophilic thin film on the back surface of the semiconductor substrate, it is avoidable that the abrasive on the back surface of the semiconductor substrate is partially dried and the abrasive grains are fixed to the back surface, so that the effect of removing the abrasive in the subsequent step can be improved.

7 Claims, 2 Drawing Sheets

METHOD OF POLISHING SEMICONDUCTOR SUBSTRATE

This is a continuation of application Ser. No. 08/354,284 filed on Dec. 12, 1994, now abandoned.

BACKGROUND OF THE INVENTION

1. Field of the Invention

This invention relates to a method of polishing the surface of a semiconductor substrate according to a chemical-mechanical polishing method (generally called as "CMP" method), and particularly to an improved polishing method with which the surface of a semiconductor substrate after polished is kept cleaned.

2. Description of the Related Art

A process of polishing the surface of a semiconductor substrate to be flat is indispensable for a manufacturing process for a semiconductor device. In most cases, a CMP (chemical-mechanical polishing) process or method in which the surface of a semiconductor substrate or wafer is polished with an abrasive has been used for a polishing process. The abrasive contains abrasive grains such silicon oxide grains of 1000 angstroms or less in grain diameter and solvent therefor.

FIGS. 1A to 1D are diagrams showing a series of steps for a conventional typical manufacturing process in which a multilayer wiring structure is obtained according to the CMP method as described above. As shown in FIG. 1A, a phosphorus glass film 12 is formed on the surface of a semiconductor substrate 11 of silicon and then a first metal wiring 13 and a plasma oxide film 14 serving as a layer insulating film are laminated in this order on the phosphorus glass film 12. Thereafter, as shown in FIG. 1B, an abrasive 16 containing abrasive grains 17 and solvent is supplied onto the surface of the plasma oxide film 14, and then the uneven surface (projecting portion) of the plasma oxide film 14 is polished and flattened (that is, the CMP method is applied). After the polishing step, the abrasive 16 remains on the whole surface of the plasma oxide film 14 which is hydrophilic.

Subsequently, in a step shown in FIG. 1C, the surface of the semiconductor substrate 11 is scrubbed to remove the remaining abrasive 16, so that the concentration of the abrasive grains 17 in the abrasive 16 is lowered. Thereafter, in a step shown in FIG. 1D, the semiconductor substrate 11 is immersed into hydrofluoric acid solution (HF:H$_2$O=about 1:about 100) to clean the substrate, and then drawn up from the solution so that the substrate is washed with water and dried, whereby the abrasive 16 is removed from the surface of the plasma oxide film 14. Finally, a through hole is formed in the plasma oxide film 14 as shown in FIG. 1D and a second metal wiring 18 is formed in a desired pattern, thereby completing the multilayer wiring structure.

In the conventional CMP method as described above, when the abrasive 16 is supplied onto the surface of the semiconductor substrate 11 in the step of FIG. 1B, it is unavoidable that the abrasive 16 partially goes along the side surface of the semiconductor substrate 11 and reaches the back surface side thereof. Generally, the back surface of the semiconductor substrate 11 comprises a barrier metal film which is formed of titan and titan nitride film, and thus in order to perform a temperature monitoring in an annealing treatment, an oxide film on the back surface of the silicon substrate is removed to exposed silicon to the outside. That is, the back surface of the semiconductor substrate 11 is kept hydrophobic. Accordingly, in most cases, the abrasive 16 remains at a portion on the hydrophobic back surface of the semiconductor substrate as described above, and the solvent is dried and the abrasive grains (silicon oxide grains) 17 adhere to the back surface at the other portion.

Therefore, even when the scrubbing treatment in the step shown in FIG. 1C and the cleaning and water-washing treatment in the step shown in FIG. 1D are subsequently performed on the semiconductor substrate, it is difficult to remove the abrasive grains 17 which are dried on the hydrophobic surface of the back surface of the semiconductor substrate as described above, so that the grains 17 are left adhering to the back surface of the semiconductor substrate 11. In this case, the abrasive grains may further adhere to the hydrophobic back surface of the semiconductor substrate again when the semiconductor substrate 11 is drawn up from the hydrofluoric acid solution, and remain on the hydrophobic back surface. For example, for 6 semiconductor wafers, there are some cases where abrasive grains whose number is 10000 or more still remain on the back surface of the wafers when the back surface is hydrophobic.

These residual abrasive grains will act as foreign matters in the subsequent steps, and thus they will obstruct the manufacturing process for fine semiconductor devices. In order to avoid this problem, the following method has been proposed: the back surface of the semiconductor substrate is treated so that it becomes hydrophilic, and then it is cleaned. For example, Japanese Laid-Open Patent Application No. 62198127 discloses a method of conducting a hydrofluorination treatment on the back surface of the semiconductor substrate and then supplying ozone to the back surface to perform a hydrophilic treatment (i.e., to make the back surface hydrophilic). However, the abrasive grains which have adhered to the back surface during the treatment process of the CMP method cannot be perfectly removed by merely chemically treating the back surface of the semiconductor substrate so that the back surface has a hydrophilic property. On the other hand, Japanese Laid-Open patent Application No. 6319825 discloses a cleaning method of performing the hydrophilic treatment using a mixture of hydrofluoric acid and alcohol. However, in this case the abrasive grains adhering to the back surface in the CMP process cannot be also perfectly removed. Further, Japanese Laid-Open Patent Application No. 2116130 discloses a method of conducting the hydrophilic treatment on the semiconductor substrate with oxygen plasma and then cleaning (washing) it with high pressure water. This method has some effect because the abrasive grains are physically removed, however, it is actually impossible to remove all the abrasive grains whose number exceeds 10000.

SUMMARY OF THE INVENTION

An object of the present invention is to provide a polishing method in which abrasive grains remaining on the surface of a semiconductor substrate are substantially perfectly removed to achieve a high quality cleaning treatment on the surface of the semiconductor substrate.

In order to attain the above object, according to the present invention, a polishing method of chemically and mechanically polishing an insulating film of a silicon semiconductor substrate which comprises the insulating film on one surface thereof and silicon exposed to the outside at the other surface thereof, comprises the steps of forming a hydrophilic thin film on the silicon surface exposed to the outside, polishing the insulating film by a chemical and mechanical polishing treatment after the hydrophilic film is formed, and removing the abrasive grains adhering to the surface of the substrate by a scrubbing treatment.

The insulating thin film formed on the back surface preferably comprises a silicon oxide film which is obtained by conducting an $O_2$-plasma treatment on the semiconductor substrate.

The scrubbing treatment to remove the abrasive grains becomes more effectively by conducting the treatment with polyester cloth while pouring pure water.

According to the present invention, after the hydrophilic film is removed by an etching treatment, etching liquid used in the etching treatment is substituted by pure water.

This invention is effectively applied to a case where the surface of a plasma oxide film serving as a layer insulating film of a multilayer wiring structure is polished according to a CMP method, and it may be also applied to a case where an insulating film of a semiconductor substrate having another structure is polished and flattened according to the CMP method.

According to the polishing method as described above, the abrasive grains in an abrasive can be effectively removed, so that the surface of the semiconductor substrate can be flattened and cleaned. Accordingly, the polishing method according to the present invention can avoid an adverse effect of abrasive grains adhering to semiconductor substrate on the manufacturing process for semiconductor devices, so that fine semiconductor devices can be manufactured.

DETAILED DESCRIPTION OF THE INVENTION

Figure 1A:
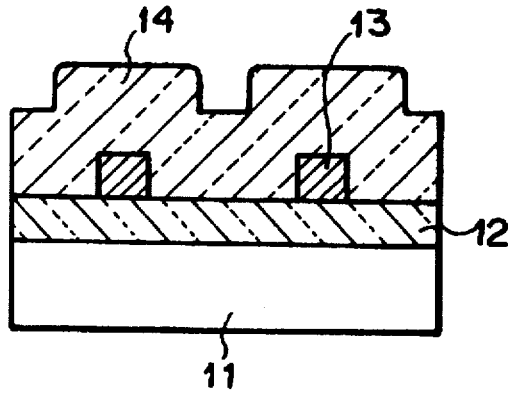
FIGS. 1A to 1D show a series of steps of a conventional polishing method.
Figure 1B:
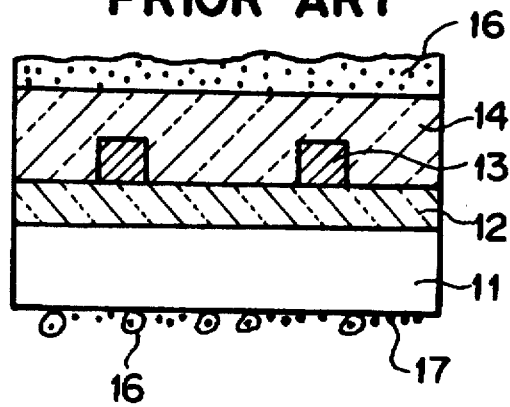
Figure 1C:
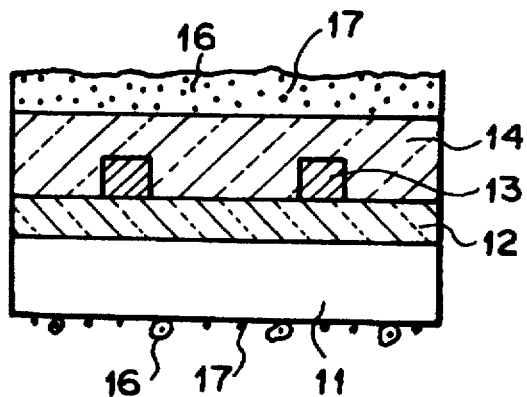
Figure 1D:
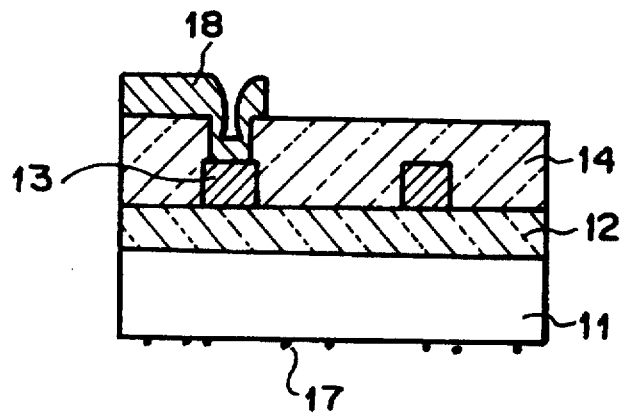
Figure 2A:
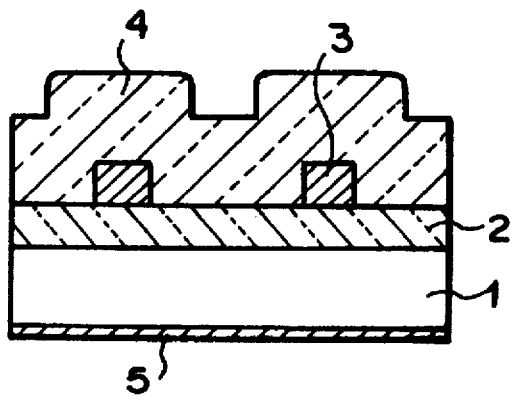
FIGS. 2A to 2E show a series of steps of a polishing method according to the present invention.
Figure 2B:
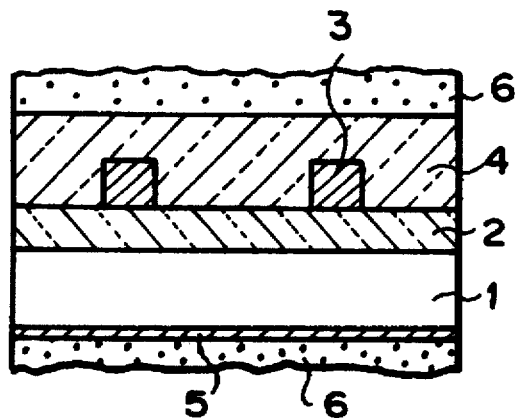

A preferred embodiment of the present invention will be described with reference to FIGS. 2A to 2B showing a series of steps of polishing a semiconductor substrate according to the polishing method of the present invention. In this embodiment, the polishing method of the present invention is applied to a case where a two layer wiring structure is formed on a semiconductor substrate.

In a step shown in FIG. 2A, a phosphorus glass film 2 is formed on the surface of a semiconductor substrate 1 of silicon, and then a first metal wiring 3 of about 6,000 angstroms thick and a plasma oxide film 4 of about 20,000 angstroms thick which serves as a layer insulating film are laminated in this order on the phosphorus glass film 2. Until this step, the back surface of the semiconductor substrate 1 is kept in such a state that silicon is exposed to the outside to easily perform a temperature monitoring, etc., for example, at the time when the first metal wiring 4 is formed. The semiconductor substrate 1 as described above is subjected to the $O_2$-plasma treatment under a suitable condition, for example, at 450 W and for 10 minutes to form a silicon oxide thin film 5 on the back surface of the semiconductor substrate 1, whereby the back surface of the semiconductor substrate becomes hydrophilic.

Subsequently, the semiconductor substrate is flattened by polishing an uneven portion on the surface of the plasma oxide film 4 according to the CMP method as shown in FIG. 2B. The CMP method is effectively performed by supplying an abrasive containing silicon oxide grains serving as abrasive grains and solvent onto the plasma oxide film 4, and polishing the plasma oxide film 4 under conditions: under a load of about 0.4 Kg/cm$^3$, at a rotating number of 35 rpm and for 5 minutes. Through the CMP method (process), the abrasive remains on the whole surface of the plasma oxide film 4 which is the hydrophilic surface, and it further remains on the whole hydrophilic surface of the oxide thin film 5 which is on the back surface of the semiconductor substrate 1.

Figure 2C:
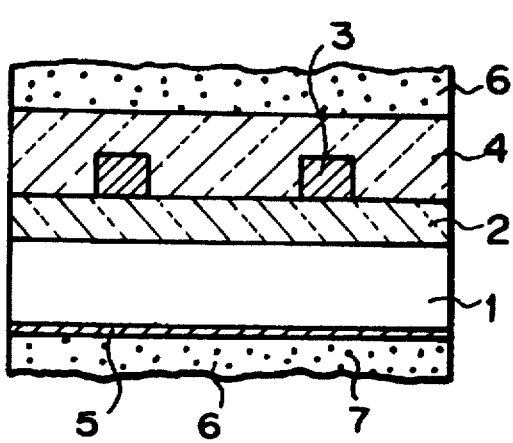

Subsequently, both surfaces (front and back surfaces) of the semiconductor substrate 1 are scrubbed under a suitable condition (for example, under about 300 g load and for 3 minutes), preferably using polyester cloth, while pouring pure water onto the semiconductor substrate 1, thereby physically removing the abrasive 6. At this time, the scrubbing treatment of the both surfaces of the semiconductor substrate 1 can remove the abrasive grains 7 of the abrasive 6 which remain on each surface of the semiconductor substrate 1 as shown in FIG. 2C, so that the concentration of the abrasive grains 7 is reduced.

Figure 2D:
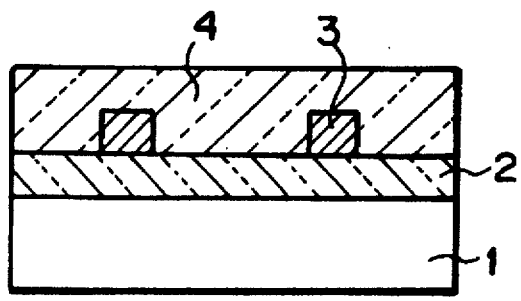

Thereafter, the semiconductor substrate 1 is immersed in a hydrofluoric acid solution (HF:H$_2$O=about 1: about 100) accommodated in a cleaning tank for two minutes to perform the cleaning (washing) treatment. Then, the hydrofluoric acid solution is substituted by pure water in the tank so that the semiconductor substrate is washed with pure water, and then the semiconductor substrate 1 is dried. With this cleaning (washing) treatment, the abrasive 6 is removed from the surface of the plasma oxide film 4, and the abrasive 6 and the oxide thin film 5 are removed from the back surface of the semiconductor substrate 1 as shown in FIG. 2D. At this time, the oxide thin film 5 which is the hydrophilic surface is removed, and thus the back surface of the semiconductor substrate 1 becomes hydrophobic. However, the solution is substituted by the pure water in the cleaning tank, and thus there is no possibility that the abrasive grains adhere to the back surface of the semiconductor substrate 1 again.

Figure 2E:
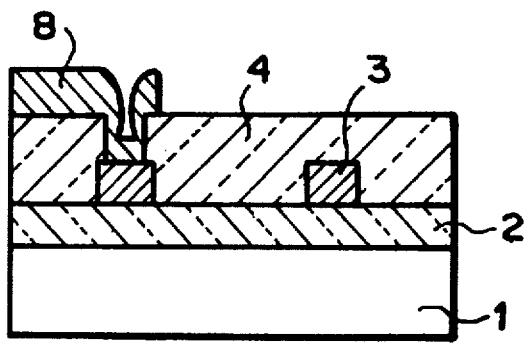

Finally, a through hole is formed in the plasma oxide film 4, and a second metal wiring 8 is formed in a desired pattern, thereby completing the multilayer wiring structure as shown in FIG. 2E.

EXAMPLE

A 6 inch hydrophobic silicon substrate was used as a sample, and the surface of the silicon substrate on which silicon was exposed to the outside was subjected to the $O_2$-plasma treatment at RF power of 450 W and for 10 minutes in a batch type $O_2$-plasma treatment apparatus, whereby the surface of the silicon substrate was made hydrophilic. Thereafter, the CMP process was conducted on the surface of the silicon substrate. For the purpose of comparison, the CMP process was also conducted on both of a silicon substrate which had been subjected to no hydrophilic treatment and a silicon wafer on which an oxide film had been formed in advance.

The experimental conditions were as follows:
CMP condition: under load of about 0.4 Kg/cm$^2$ load, at rotating number of 35 rpm and for 5 minutes.
Scrubbing condition: under load of about 300 g and for 3 minutes (use of polyester cloth).
Cleaning condition: hydrofluoric acid solution (HF:H$_2$O= about 1: about 100) in a cleaning tank of 5 liters and for 2 minutes, and then the solution was substituted by pure water.

The silicon substrates thus formed were tested with a grain detector using an He-Ne laser to check existence of abrasive grains having a diamter of 0.3 μm or more. The result is as follows.

| SAMPLE | NUMBER OF RESIDUAL ABRASIVE GRAINS |
| --- | --- |
| THIS INVENTION | 109 |
| HYDROPHOBIC SUBSTRATE | 10,000 or more |
| WAFER HAVING OXIDE FILM | 58 |

As is apparent from the above result, according to this invention, the number of residual abrasive grains adhering onto the surface of the semiconductor substrate is reduced to about 100, which corresponds to about one hundredth of the hydrophobic substrate (prior art).

What is claimed is:

1. A polishing method of chemically and mechanically polishing an insulating film of a silicon semiconductor substrate which comprises the insulating film on one surface thereof and silicon exposed to the outside at the other surface thereof, comprising the steps of:

forming a hydrophilic thin film by $O_2$-plasma treatment on the silicon surface exposed to the outside;

polishing said insulating film by a chemical and mechanical polishing treatment after said hydrophilic thin film is formed; and removing abrasive grains adhering to the surface of the substrate by a scrubbing treatment.

2. The polishing method as claimed in claim 1, wherein said insulating film has a thickness of about 20,000 angstroms.

3. The polishing method as claimed in claim 1, wherein said scrubbing treatment is performed with polyester cloth while pouring pure water.

4. The polishing method as claimed in claim 1, further comprising the step of removing said hydrophilic film by an etching treatment after the abrasive grains are removed by the scrubbing treatment.

5. The polishing method as claimed in claim 4, wherein said etching treatment is performed by immersing said semiconductor substrate into hydrofluoric acid solution.

6. The polishing method as claimed in claim 5, wherein the concentration of said hydrofluoric acid solution is set as follows: HF:H2O=about 1: about 100.

7. The polishing method as claimed in claim 4, wherein said etching treatment is performed in a hydrofluoric acid solution accommodating tank, and the hydrofluoric acid solution is substituted by pure water after said etching treatment is completed.

* * * * *